US012593511B2

(12) United States Patent
Roy et al.

(10) Patent No.: US 12,593,511 B2
(45) Date of Patent: Mar. 31, 2026

(54) RADIO FREQUENCY INTERFERENCE MITIGATION FOR SILICON-ON-INSULATOR DEVICES

(71) Applicant: Skyworks Solutions, Inc., Irvine, CA (US)

(72) Inventors: Ambarish Roy, Arlington, MA (US); Richard Peter Gulezian, II, Atkinson, NH (US); Lakshminarayanan Alampoondi Venkatesan, Woburn, MA (US); Nuttapong Srirattana, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 363 days.

(21) Appl. No.: 18/197,622

(22) Filed: May 15, 2023

(65) Prior Publication Data

US 2023/0369338 A1 Nov. 16, 2023

Related U.S. Application Data

(60) Provisional application No. 63/342,545, filed on May 16, 2022, provisional application No. 63/342,549, filed on May 16, 2022.

(51) Int. Cl.
*H10D 87/00* (2025.01)
*H01L 23/48* (2006.01)
(Continued)

(52) U.S. Cl.
CPC ........... *H10D 87/00* (2025.01); *H01L 23/481* (2013.01); *H01L 23/5286* (2013.01);
(Continued)

(58) Field of Classification Search
CPC ...... H10D 87/00; H10D 86/201; H10D 86/80; H01L 23/481; H01L 23/5286;
(Continued)

(56) References Cited

U.S. PATENT DOCUMENTS 6,777,774 B2 8/2004 Beng et al.
7,368,760 B2 5/2008 Levin et al.
(Continued)

FOREIGN PATENT DOCUMENTS

CN 100413078 C 8/2008
CN 106449593 A 2/2017
(Continued)

OTHER PUBLICATIONS

U.S. Appl. No. 18/197,616, filed May 15, 2023, Noise Reduction In Silicon-On-Insulator Devices.

*Primary Examiner* — Herve-Louis Y Assouman
(74) *Attorney, Agent, or Firm* — Knobbe, Martens, Olson & Bear, LLP

(57) ABSTRACT

Disclosed is a silicon on insulator (SOI) radio frequency (RF) module with noise reduction shielding to mitigate radio frequency interference (RFI) between active circuit devices within the module. The RF module includes various semiconductor active devices disposed upon an insulating substrate. The RF module can be a front-end module (FEM) with one or more charge pumps as active devices. A polysilicon web extends between and underneath the devices to create a network of ground paths across a surface of the insulating substrate. The ground paths effectively conduct RF noise to a circuit ground, causing the polysilicon ground web to eliminate or substantially attenuate RFI produced by the active devices without altering signal characteristics of
(Continued)

the RF module. The disclosed solution also reduces RF noise leakage into the substrate, and can reduce RFI between neighboring RF modules.

20 Claims, 15 Drawing Sheets

(51) Int. Cl.
| | |
|---|---|
| *H01L 23/528* | (2006.01) |
| *H01L 23/66* | (2006.01) |
| *H10D 86/00* | (2025.01) |
| *H10D 86/80* | (2025.01) |

(52) U.S. Cl.
CPC ........... *H01L 23/66* (2013.01); *H10D 86/201* (2025.01); *H01L 2223/6677* (2013.01)

(58) Field of Classification Search
CPC ............ H01L 23/66; H01L 2223/6677; H01Q 1/2283; H01Q 21/065
See application file for complete search history.

(56) References Cited

U.S. PATENT DOCUMENTS

| | | |
|---|---|---|
| 7,732,866 B2 | 6/2010 | Cote et al. |
| 9,160,328 B2 | 10/2015 | Altunkilic et al. |
| 9,456,490 B2 | 9/2016 | Roy et al. |
| 9,467,124 B2 | 10/2016 | Crandall et al. |
| 9,548,522 B2 | 1/2017 | Whitefield et al. |
| 9,577,626 B2 | 2/2017 | Crandall et al. |
| 9,721,936 B2 | 8/2017 | Zhu et al. |
| 9,729,048 B2 | 8/2017 | Crandall et al. |
| 9,741,653 B2 | 8/2017 | Roy et al. |
| 9,837,993 B2 | 12/2017 | Crandall et al. |
| 9,847,774 B2 | 12/2017 | Crandall et al. |
| 9,852,978 B2 | 12/2017 | Roy et al. |
| 9,871,512 B2 | 1/2018 | Ho |
| 9,888,564 B2 | 2/2018 | Roy et al. |
| 9,935,627 B2 | 4/2018 | Cebi et al. |
| 9,948,313 B1 | 4/2018 | Rafi |
| 9,953,938 B2 | 4/2018 | Srirattana et al. |
| 9,954,564 B2 | 4/2018 | Little et al. |
| 9,979,068 B2 | 5/2018 | Whitefield et al. |
| 10,056,901 B2 | 8/2018 | Roy et al. |
| 10,069,492 B2 | 9/2018 | Ho |
| 10,103,726 B2 | 10/2018 | Wilz et al. |
| 10,164,681 B2 | 12/2018 | Roy et al. |
| 10,229,902 B2 | 3/2019 | Zhu et al. |
| 10,256,794 B2 | 4/2019 | Srirattana et al. |
| 10,284,200 B2 | 5/2019 | Roy et al. |
| 10,326,443 B2 | 6/2019 | Ho |
| 10,483,843 B2 | 11/2019 | Crandall et al. |
| 10,541,682 B2 | 1/2020 | Popplewell et al. |
| 10,547,305 B2 | 1/2020 | Wilz et al. |
| 10,680,516 B2 | 6/2020 | Crandall et al. |
| 10,700,063 B2 | 6/2020 | Blin et al. |
| 10,749,512 B2 | 8/2020 | Balteanu et al. |
| 10,840,233 B2 | 11/2020 | Zhu et al. |
| 10,985,733 B2 | 4/2021 | Srirattana et al. |
| 11,159,158 B2 | 10/2021 | Popplewell et al. |
| 11,177,802 B2 | 11/2021 | Yang et al. |
| 11,190,182 B2 | 11/2021 | Balteanu et al. |
| 11,196,159 B2 | 12/2021 | Liu et al. |
| 11,217,581 B2 | 1/2022 | Blin et al. |
| 11,374,491 B2 | 6/2022 | Lam |
| 11,431,327 B2 | 8/2022 | Balteanu et al. |
| 11,502,678 B2 | 11/2022 | Yang et al. |
| 11,595,008 B2 | 2/2023 | Jain et al. |
| 11,658,568 B2 | 5/2023 | Lam |
| 11,682,699 B2 | 6/2023 | Roy et al. |
| 11,689,202 B2 | 6/2023 | Balteanu et al. |
| 11,817,456 B2 | 11/2023 | Blin et al. |
| 11,817,829 B2 | 11/2023 | Padyana et al. |
| 11,855,361 B2 | 12/2023 | Liu et al. |
| 11,923,808 B2 | 3/2024 | Jain et al. |
| 11,973,115 B2 | 4/2024 | Roy et al. |
| 12,028,072 B2 | 7/2024 | Balteanu et al. |
| 12,057,611 B2 | 8/2024 | Srirattana et al. |
| 12,074,573 B2 | 8/2024 | Padyana et al. |
| 12,142,809 B2 | 11/2024 | Yang et al. |
| 12,184,240 B2 | 12/2024 | Jain et al. |
| 2003/0197243 A1 | 10/2003 | Beng et al. |
| 2005/0273732 A1 | 12/2005 | Xu et al. |
| 2006/0125039 A1 | 6/2006 | Levin et al. |
| 2007/0221990 A1 | 9/2007 | Cote et al. |
| 2008/0217727 A1 | 9/2008 | Kjar |
| 2009/0020856 A1 | 1/2009 | Collins et al. |
| 2009/0106713 A1 | 4/2009 | Collins et al. |
| 2009/0146211 A1 | 6/2009 | Cote et al. |
| 2009/0250262 A1 | 10/2009 | Jin |
| 2014/0009207 A1 | 1/2014 | Cebi et al. |
| 2014/0009214 A1 | 1/2014 | Altunkillic et al. |
| 2014/0042637 A1 | 2/2014 | Shinh et al. |
| 2015/0041917 A1 | 2/2015 | Zhu et al. |
| 2015/0129965 A1 | 5/2015 | Roy et al. |
| 2015/0145614 A1 | 5/2015 | Whitefield et al. |
| 2016/0066416 A1 | 3/2016 | Roy et al. |
| 2016/0225709 A1 | 8/2016 | Roy et al. |
| 2017/0013708 A1 | 1/2017 | Roy et al. |
| 2017/0125874 A1 | 5/2017 | Whitefield et al. |
| 2017/0141759 A1 | 5/2017 | Srirattana et al. |
| 2017/0230066 A1 | 8/2017 | Little et al. |
| 2017/0237432 A1 | 8/2017 | Roy et al. |
| 2017/0287854 A1 | 10/2017 | Srirattana et al. |
| 2017/0287935 A1 | 10/2017 | Mason et al. |
| 2017/0346482 A1 | 11/2017 | Cebi et al. |
| 2017/0353211 A1 | 12/2017 | Roy et al. |
| 2018/0047715 A1 | 2/2018 | Zhu et al. |
| 2018/0108988 A1 | 4/2018 | Liu et al. |
| 2018/0131369 A1* | 5/2018 | Popplewell .......... H10D 89/814 |
| 2018/0331713 A1 | 11/2018 | Liu et al. |
| 2018/0351554 A1 | 12/2018 | Roy et al. |
| 2019/0206863 A1 | 7/2019 | Blin et al. |
| 2019/0207586 A1 | 7/2019 | Srirattana et al. |
| 2019/0253054 A1 | 8/2019 | Roy et al. |
| 2019/0273076 A1 | 9/2019 | Zhu et al. |
| 2019/0386104 A1* | 12/2019 | Roy ................... H10D 30/0323 |
| 2020/0153428 A1 | 5/2020 | Popplewell et al. |
| 2020/0235730 A1 | 7/2020 | Yang et al. |
| 2021/0013198 A1 | 1/2021 | Blin et al. |
| 2021/0257458 A1 | 8/2021 | Roy et al. |
| 2022/0149832 A1 | 5/2022 | Yang et al. |
| 2022/0254777 A1 | 8/2022 | Blin et al. |
| 2022/0255218 A1 | 8/2022 | Liu et al. |
| 2022/0271409 A1 | 8/2022 | Yang et al. |
| 2022/0285152 A1 | 9/2022 | Takeuchi et al. |
| 2022/0359970 A1 | 11/2022 | Srinivasan et al. |
| 2022/0359971 A1 | 11/2022 | Srinivasan et al. |
| 2022/0393326 A1 | 12/2022 | Srirattana et al. |
| 2023/0006549 A1 | 1/2023 | Liu et al. |
| 2023/0074393 A1 | 3/2023 | Balteanu et al. |
| 2023/0114964 A1 | 4/2023 | Blin et al. |
| 2023/0275127 A1 | 8/2023 | Roy et al. |
| 2023/0283178 A1 | 9/2023 | Lam |
| 2023/0369337 A1 | 11/2023 | Roy et al. |
| 2023/0369338 A1 | 11/2023 | Roy et al. |
| 2024/0030909 A1 | 1/2024 | Obkircher et al. |
| 2024/0153946 A1 | 5/2024 | Blin et al. |
| 2024/0204401 A1 | 6/2024 | Liu et al. |
| 2024/0243705 A1 | 7/2024 | Srirattana et al. |
| 2024/0347600 A1 | 10/2024 | Roy et al. |
| 2025/0007499 A1 | 1/2025 | Balteanu et al. |

FOREIGN PATENT DOCUMENTS

| | | |
|---|---|---|
| CN | 106449593 B | 9/2018 |
| CN | 110310941 A | 10/2019 |
| CN | 110310941 B | 2/2021 |
| CN | 114787993 A | 7/2022 |
| EP | 3823014 | 5/2021 |
| KR | 2021-0101321 A | 8/2021 |
| WO | WO 2005/104814 | 11/2005 |

(56)          References Cited

FOREIGN PATENT DOCUMENTS

* cited by examiner mXn DL MIMO nXm UL MIMO

RADIO FREQUENCY INTERFERENCE MITIGATION FOR SILICON-ON-INSULATOR DEVICES

CROSS-REFERENCE TO RELATED APPLICATIONS

This application claims the benefit of U.S. Provisional Application No. 63/342,545 and U.S. Provisional Application No. 63/342,549, both filed May 16, 2022. The foregoing applications are hereby incorporated by reference in their entireties. Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure generally relates to silicon-on-insulator (SOI) semiconductor devices, such as for a mobile front-end module with radio frequency noise mitigation.

Description of the Related Art

In wireless communication applications, size, cost, and performance can be important for a given product. For radio-frequency (RF) applications, it is increasingly beneficial for RF circuits and related devices to be implemented in a packaged module with a compact device footprint.

Transistors fabricated on a semiconductor-on-insulator substrate, such as N-channel Metal Oxide Semiconductor (NMOS) and P-channel MOS (PMOS) SOI transistors, can be utilized in RF switches in electronic devices, such as cellular phones. Multiple SOI transistors can be connected to form various active devices of an RF circuit, such as charge pumps.

As the footprint of SOI RF devices continues to shrink, managing RF noise emissions is more challenging. For example, with increasingly high-power active devices operating in a compact area and the advent of 5G New Radio (NR) technologies, RF noise and particularly radio frequency interference (RFI) from neighboring active devices can be a major obstacle to the miniaturization of modern RF packaged modules. Embodiments described herein mitigate RFI without altering signal characteristics of the RF module.

SUMMARY OF THE INVENTION

According to certain aspects, a silicon on insulator (SOI) radio frequency (RF) module is provided with noise reduction shielding to mitigate radio frequency interference (RFI) between active circuit devices within the module. The RF module includes various semiconductor active devices disposed upon an insulating substrate. The RF module can be a front-end module (FEM) with one or more charge pumps as active devices. A polysilicon web extends between and underneath the active devices to create a network of ground paths across a surface of the insulating substrate. The ground paths effectively conduct RF noise to a circuit ground, causing the polysilicon ground web to eliminate or substantially attenuate RFI caused by the active devices without altering signal characteristics of the RF module. The disclosed solution also reduces RF noise leakage into the substrate and can reduce RFI between neighboring RF modules.

In one aspect, a radio frequency module can include a silicon-on-insulator die having a silicon substrate, an insulating layer disposed above the silicon substrate, a polysilicon layer disposed above the insulating layer, and a plurality of metal layers above the polysilicon layer; a plurality of active devices including one or more first active devices each including at least one transistor formed in the silicon-on-insulator die and incorporating the polysilicon layer, and one or more second active devices which are non-transistor based active devices; and a polysilicon ground web formed within the polysilicon layer and connected from the polysilicon layer to a circuit ground via a path formed from the polysilicon layer through the insulating layer and the silicon substrate, a portion of the ground web extending between the one or more first active devices and the one or more second active devices, the ground web coupling one or more frequencies of radio frequency noise emissions from the plurality of active devices to the circuit ground.

The radio frequency module can include one or more second active devices that do not incorporate the polysilicon layer. The polysilicon ground web can extend beneath at least one of the one or more second active devices, or can surround one or more of the plurality of active devices. Each of the one or more first active devices can include a metal oxide semiconductor silicon-on-insulator transistor. One or more of the active devices can be a charge pump. The polysilicon ground web can be a plurality of conducting segments arranged in a rectangular grid, and the plurality of conducting segments form a perimeter around at least one of the one or more active devices. The active devices can include a combination of analog and digital devices. The radio frequency module can further include a through wafer via extending from the polysilicon layer through the insulating layer and the silicon substrate to form the path to the circuit ground from the polysilicon layer through the insulating layer and the silicon substrate.

In another aspect, a radio frequency module includes a semiconductor die having a silicon substrate, a polysilicon layer, and a plurality of metal layers above the polysilicon layer; a first active device formed in the semiconductor die and a second active device formed in the semiconductor die; and a polysilicon ground web formed within the polysilicon layer and connected from the polysilicon layer to a circuit ground via a path formed from the polysilicon layer through silicon substrate, the ground web extending around at least a portion of a periphery of the first active device, at least a portion of a periphery of the second active device, and between the first active device and the second active device.

In some cases, the first active device can include a transistor and the second active device does not include a transistor. Each of the first active devices can include a metal oxide semiconductor silicon-on-insulator transistor. In some cases, the second active device is a metal-insulator-metal (MIM) capacitor. In certain implementations, the polysilicon ground web extends beneath the second active device but not beneath the first active device. The module can be a radio frequency front-end module including one or more power amplifiers and one or more charge pumps. The module can further include a through wafer via extending from the polysilicon layer through the silicon substrate to form the path to the circuit ground.

In yet another aspect, a silicon-on-insulator semiconductor die can include a silicon substrate, an insulating layer disposed above the silicon substrate, a polysilicon layer disposed above the insulating layer, and a plurality of metal layers above the polysilicon layer; a plurality of active devices including one or more first active devices each including at least one transistor formed in the silicon-on-insulator die and incorporating the polysilicon layer, and one or more second active devices which are non-transistor based active devices; and a polysilicon ground web formed within the polysilicon layer and connected from the polysilicon layer to a circuit ground via a path formed from the polysilicon layer through the insulating layer and the silicon substrate, a portion of the ground web extending between the one or more first active devices and the one or more second active devices, the ground web coupling one or more frequencies of radio frequency noise emissions from the plurality of active devices to the circuit ground.

In some cases, the second active devices do not incorporate the polysilicon layer. The polysilicon ground web can extend beneath at least one of the one or more second active devices. The polysilicon ground web may be configured to surround one or more of the plurality of active devices. Each of the one or more first active devices can include a metal oxide semiconductor silicon-on-insulator transistor. One or more of the one or more first active devices can be a charge pump. The polysilicon ground web can be a plurality of conducting segments arranged in a rectangular grid, and the plurality of conducting segments form a perimeter around at least one of the one or more active devices. The active devices can include a combination of analog and digital devices. The radio frequency module can further include a through wafer via extending from the polysilicon layer through the silicon substrate to form the path to the circuit ground from the polysilicon layer through the insulating layer and the silicon substrate.

In an additional aspect, a semiconductor die includes a silicon substrate, a polysilicon layer, and a plurality of metal layers above the polysilicon layer; a first active device and a second active device; and a polysilicon ground web formed within the polysilicon layer and connected from the polysilicon layer to a circuit ground via a path formed from the polysilicon layer through silicon substrate, the ground web extending around at least a portion of a periphery of the first active device, at least a portion of a periphery of the second active device, and between the first active device and the second active device.

The first active device can include at least one transistor and the second active device can be a device that does not include a transistor. The transistor(s) can be metal oxide semiconductor silicon-on-insulator transistors. The second active device can be a metal-insulator-metal (MIM) capacitor. The polysilicon ground web can extend beneath at least one of the one or more second active devices. The semiconductor die may be a component of a radio frequency front-end module including one or more power amplifiers and one or more charge pumps. The semiconductor die of claim can further include a through wafer via extending from the polysilicon layer through the silicon substrate to form the path to the circuit ground.

In an additional aspect, a mobile device can include a radio frequency module including a semiconductor die having a silicon substrate, a polysilicon layer, and a plurality of metal layers above the polysilicon layer; a first active device formed in the semiconductor die and a second active device formed in the semiconductor die; and a polysilicon ground web formed within the polysilicon layer and connected from the polysilicon layer to a circuit ground via a path formed from the polysilicon layer through silicon substrate, the ground web extending around at least a portion of a periphery of the first active device, at least a portion of a periphery of the second active device, and between the first active device and the second active device; and an antenna coupled to the radio frequency module.

In one further aspect, a mobile device includes a radio frequency module having a semiconductor die including a silicon substrate, a polysilicon layer, and a plurality of metal layers above the polysilicon layer; a first active device formed in the semiconductor die and a second active device formed in the semiconductor die; and a polysilicon ground web formed within the polysilicon layer and connected from the polysilicon layer to a circuit ground via a path formed from the polysilicon layer through silicon substrate, the ground web extending around at least a portion of a periphery of the first active device, at least a portion of a periphery of the second active device, and between the first active device and the second active device; and an antenna coupled to the radio frequency module.

The first active device can include at least one transistor and the second active device can be a device that does not include a transistor. In some cases, the second active device can be a metal-insulator-metal (MIM) capacitor. The polysilicon ground web can extend beneath at least one of the one or more second active devices. The module can be a radio frequency front-end module including one or more power amplifiers and one or more charge pumps. The mobile device can further include a through wafer via extending from the polysilicon layer through the silicon substrate to form the path to the circuit ground.

Any of the features, components, or details of any of the arrangements or embodiments disclosed in this application, including without limitation any of the apparatus embodiments and any of the radio frequency embodiments disclosed herein, are interchangeably combinable with any other features, components, or details of any of the arrangements or embodiments disclosed herein to form new arrangements and embodiments.

DETAILED DESCRIPTION OF THE PREFERRED EMBODIMENT

Figure 1:
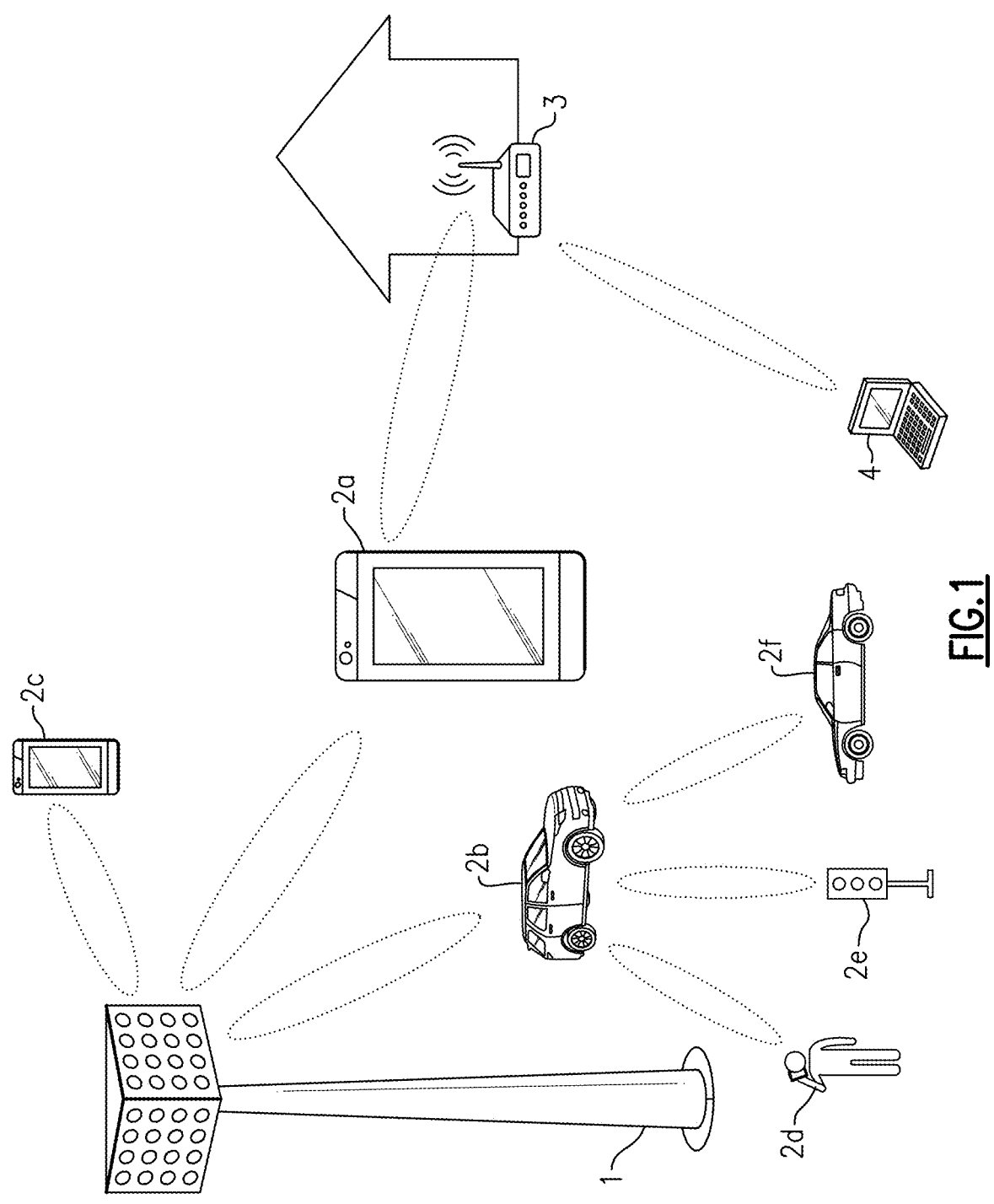
FIG. 1 is a schematic diagram of one example of a mobile device communicating via cellular and WiFi networks.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.
Mobile Communications System FIG. 1 is a schematic diagram of one example of a mobile device 2a communicating via cellular and WiFi networks. For example, as shown in FIG. 1, the mobile device 2a communicates with a base station 1 of a cellular network and with a WiFi access point 3 of a WiFi network. FIG. 1 also depicts examples of other user equipment (UE) communicating with the base station 1, for instance, a wireless-connected car 2b and another mobile device 2c. Furthermore, FIG. 1 also depicts examples of other WiFi-enabled devices communicating with the WiFi access point 3, for instance, a laptop 4.

Although specific examples of cellular UE and WiFi-enabled devices is shown, a wide variety of types of devices can communicate using cellular and/or WiFi networks. Examples of such devices, include, but are not limited to, mobile phones, tablets, laptops, Internet of Things (IoT) devices, wearable electronics, customer premises equipment (CPE), wireless-connected vehicles, wireless relays, and/or a wide variety of other communication devices.

In certain implementations, UE, such as the mobile device 2a of FIG. 1, is implemented to support communications using a number of technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

Furthermore, certain UE can communicate not only with base stations and access points, but also with other UE. For example, the wireless-connected car 2b can communicate with a wireless-connected pedestrian 2d, a wireless-connected stop light 2e, and/or another wireless-connected car 2f using vehicle-to-vehicle (V2V) and/or vehicle-to-everything (V2X) communications.

Although various examples of communication technologies have been described, mobile devices can be implemented to support a wide range of communications.

Various communication links have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

Different users of the illustrated communication networks can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Certain RF communication systems include multiple transceivers for communicating using different wireless networks, over multiple frequency bands, and/or using different communication standards. Although implementing an RF communication system in this manner can expand functionality, increase bandwidth, and/or enhance flexibility, a number of coexistence issues can arise between the transceivers operating within the RF communication system.

For example, an RF communication system can include a cellular transceiver for processing RF signals communicated over a cellular network and a wireless local area network (WLAN) transceiver for processing RF signals communicated over a WLAN network, such as a WiFi network. For instance, the mobile device 2a of FIG. 1 is operable to communicate using cellular and WiFi networks.

Although implementing the RF communication system in this manner can provide a number of benefits, a mutual desensitization effect can arise from cellular transmissions interfering with reception of WiFi signals and/or from WiFi transmissions interfering with reception of cellular signals.

In one example, cellular Band 7 can give rise to mutual desensitization with respect to 2.4 Gigahertz (GHz) WiFi. For instance, Band 7 has an FDD duplex and operates over a frequency range of about 2.62 GHz to 2.69 GHz for downlink and over a frequency range of about 2.50 GHz to about 2.57 GHz for uplink, while 2.4 GHz WiFi has TDD duplex and operates over a frequency range of about 2.40 GHz to about 2.50 GHz. Thus, cellular Band 7 and 2.4 GHz WiFi are adjacent in frequency, and RF signal leakage due to the high power transmitter of one transceiver/front-end affects receiver performance of the other transceiver/front-end, particularly at border frequency channels.

In another example, cellular Band 40 and 2.4 GHz WiFi can give rise to mutual desensitization. For example, Band 40 has a TDD duplex and operates over a frequency range of about 2.30 GHz to about 2.40 GHz, while 2.4 GHz WiFi has TDD duplex and operates over a frequency range of about 2.40 GHz to about 2.50 GHz. Accordingly, cellular Band 40 and 2.4 GHz WiFi are adjacent in frequency and give rise to a number of coexistence issues, particularly at border frequency channels.

Desensitization can arise not only from direct leakage of an aggressor transmit signal to a victim receiver, but also from spectral regrowth components generated in the transmitter. Such interference can lie relatively closely in frequency with the victim receive signal and/or directly overlap it.

Figure 2A:
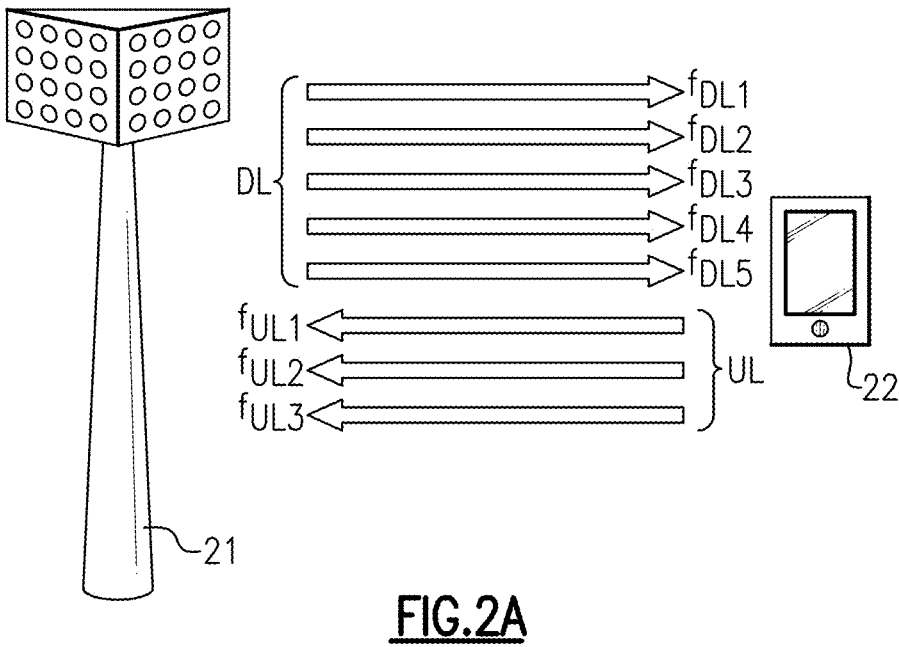
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers fUL1, fUL2, and fUL3. Additionally, the downlink channel includes five aggregated component carriers fDL1, fDL2, fDL3, fDL4, and fDL5. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
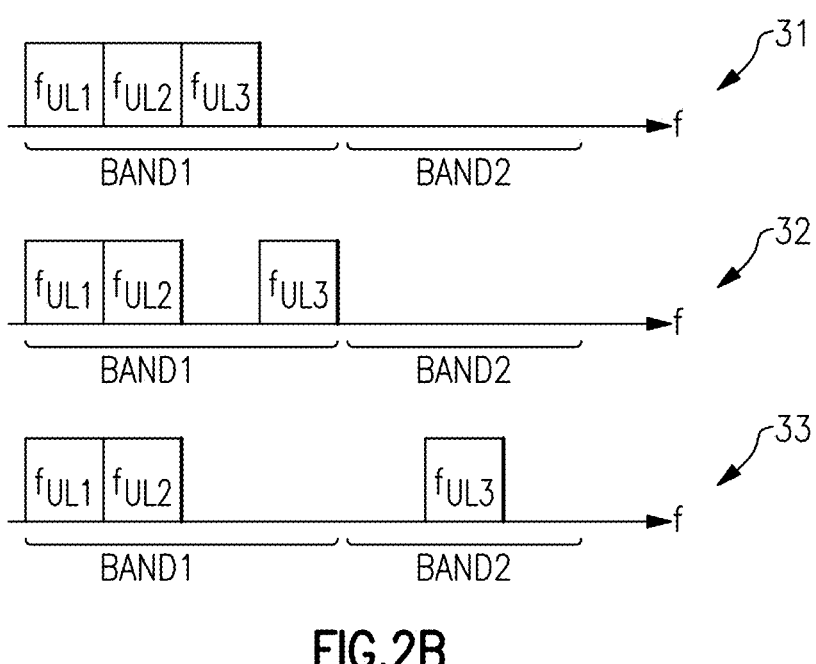
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier fUL1, a second component carrier fUL2, and a third component carrier fUL3. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers fUL1, fUL2, and fUL3 that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers fUL1, fUL2, and fUL3 that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers fUL1 and fUL2 of a first frequency band BAND1 with component carrier fUL3 of a second frequency band BAND2.

Figure 2C:
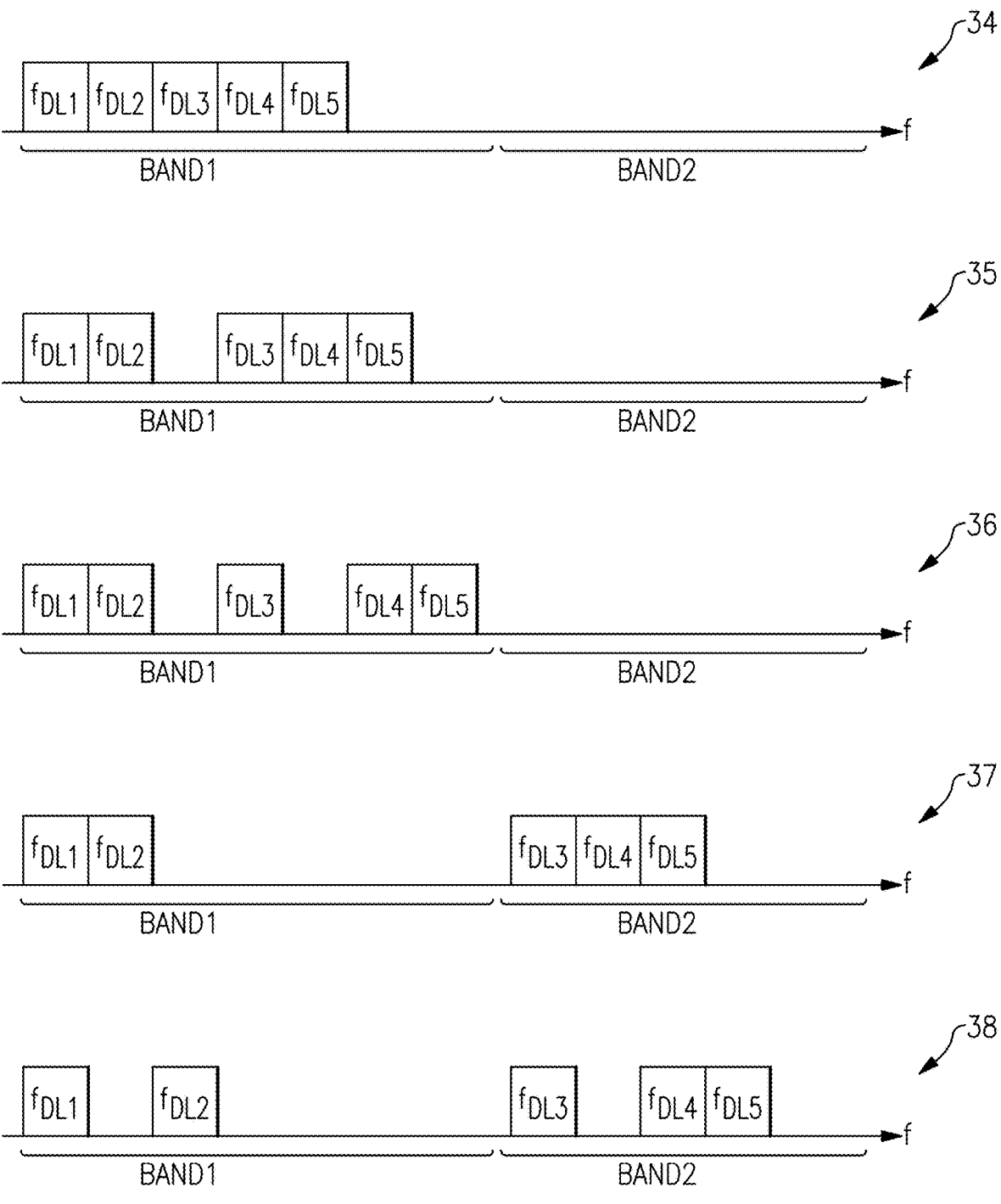
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier fDL1, a second component carrier fDL2, a third component carrier fDL3, a fourth component carrier fDL4, and a fifth component carrier fDL5. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
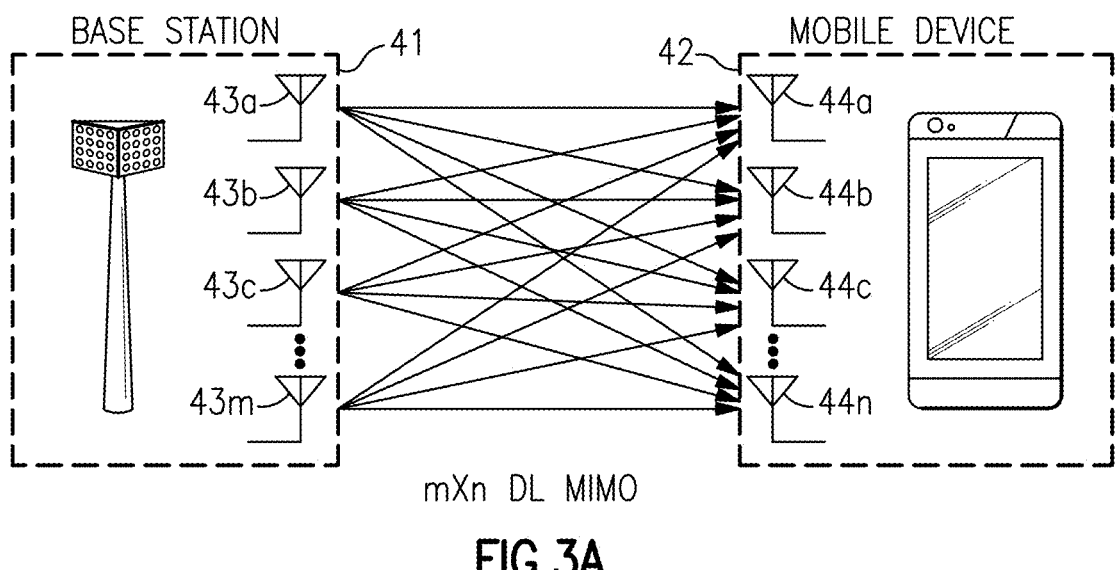
FIG. 3A is a schematic diagram of one example of a downlink channel using multi-input and multi-output (MIMO) communications.
Figure 3B:
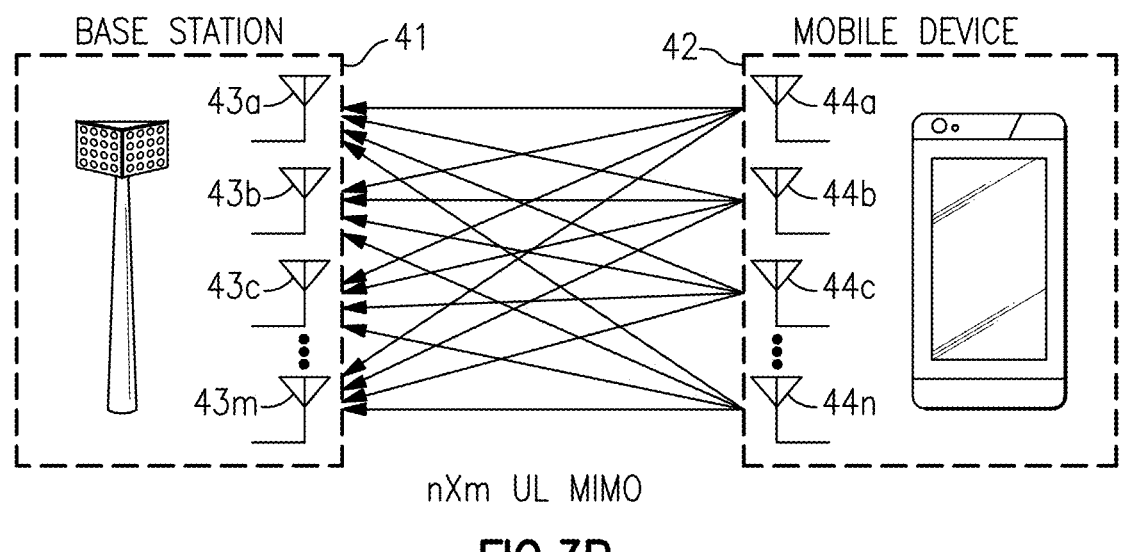
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
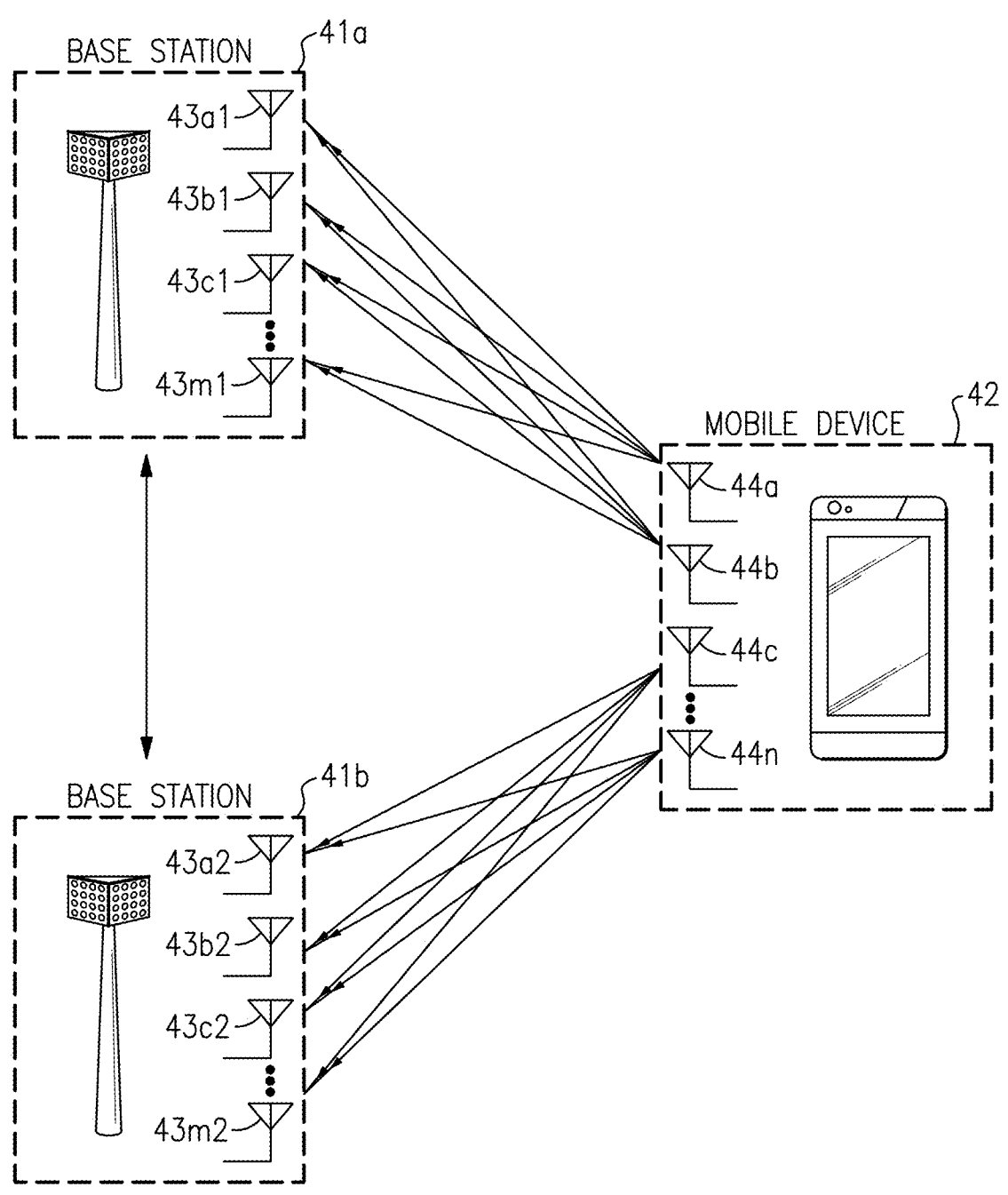
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, 43m1 of a first base station 41a, while a second portion of the uplink transmissions are received using M antennas 43a2, 43b2, 43c2, 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

SOI Ground Web Noise Reduction

Figure 4A:
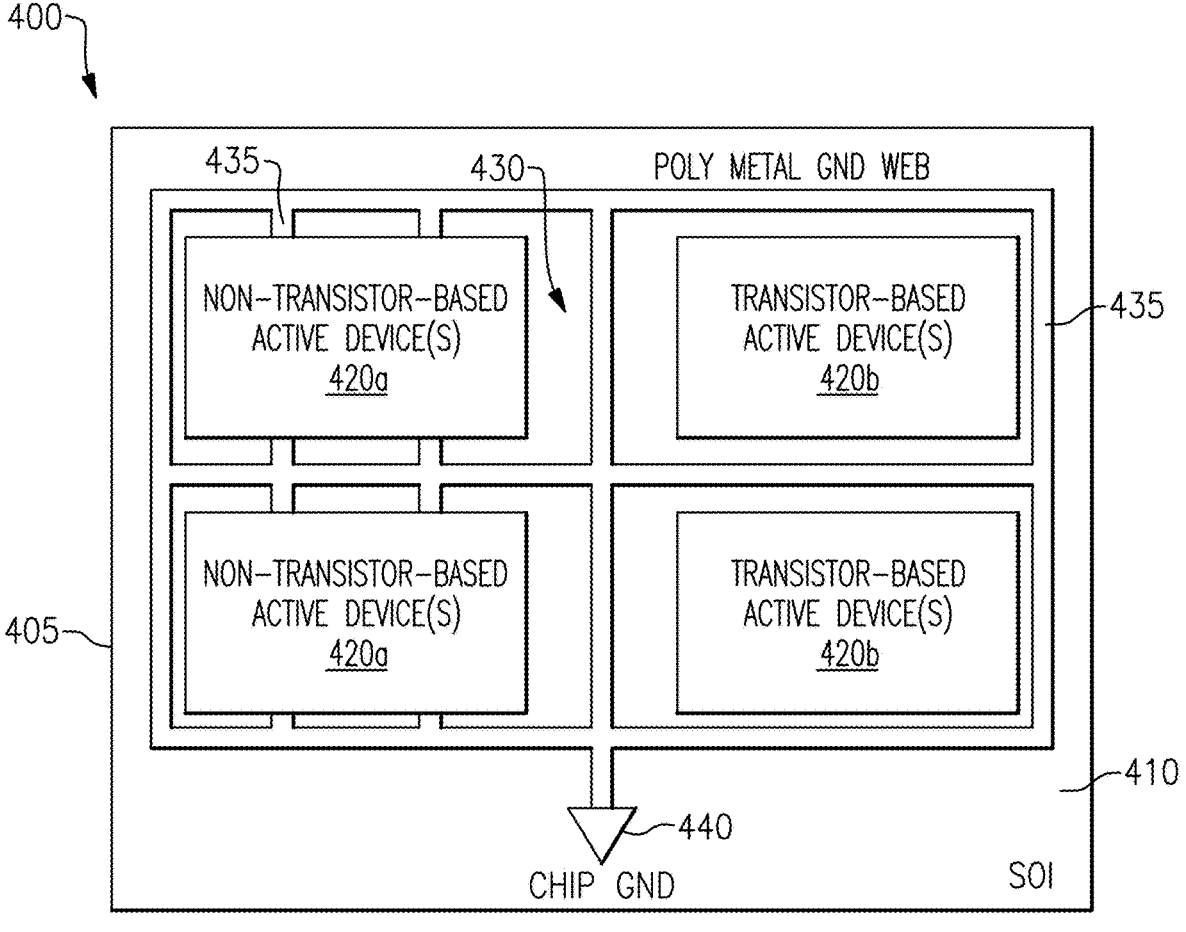
FIG. 4A is a schematic representation of one example of a SOI RF module with a polysilicon ground web.

FIG. 4A is a top plan schematic representation of one example of a SOI RF module 400 with a polysilicon ground web 430. The RF module 400 is implemented on a die 405 provided with an insulating substrate 410.

The insulating substrate 410 has a planar upper surface upon which one or more SOI transistors and/or one or more other active devices can be fabricated to form a plurality of noise-carrying active devices 420. The SOI transistors can be N-channel Metal Oxide Semiconductor (NMOS) and/or P-channel MOS (PMOS) SOI transistors, but can include metal-semiconductor field-effect-transistors (MESFETs) or other semiconductor devices.

Figure 4B:
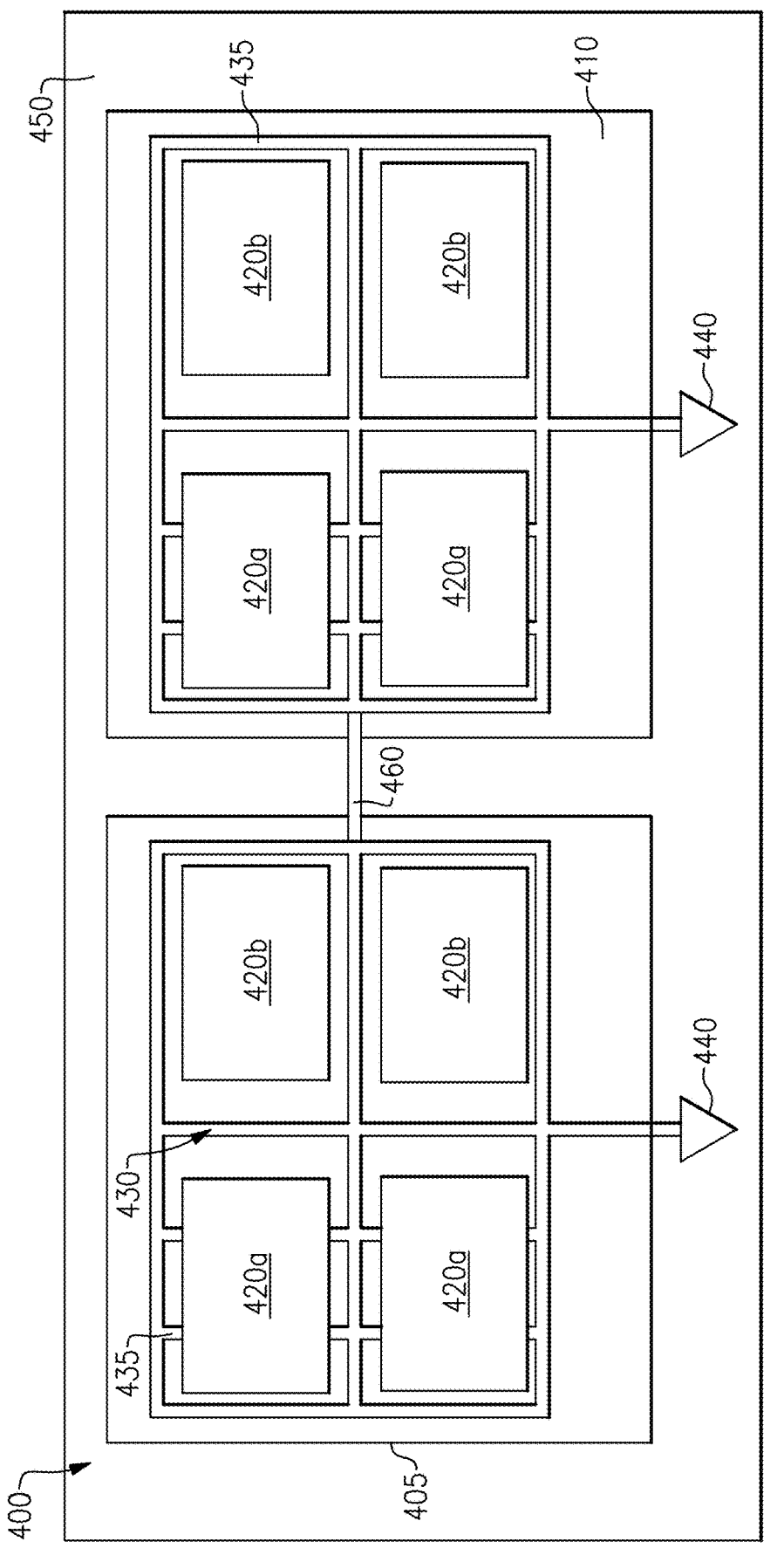
FIG. 4B is a schematic representation of a multi-chip SOI RF module with a polysilicon ground web.
Figure 5A:
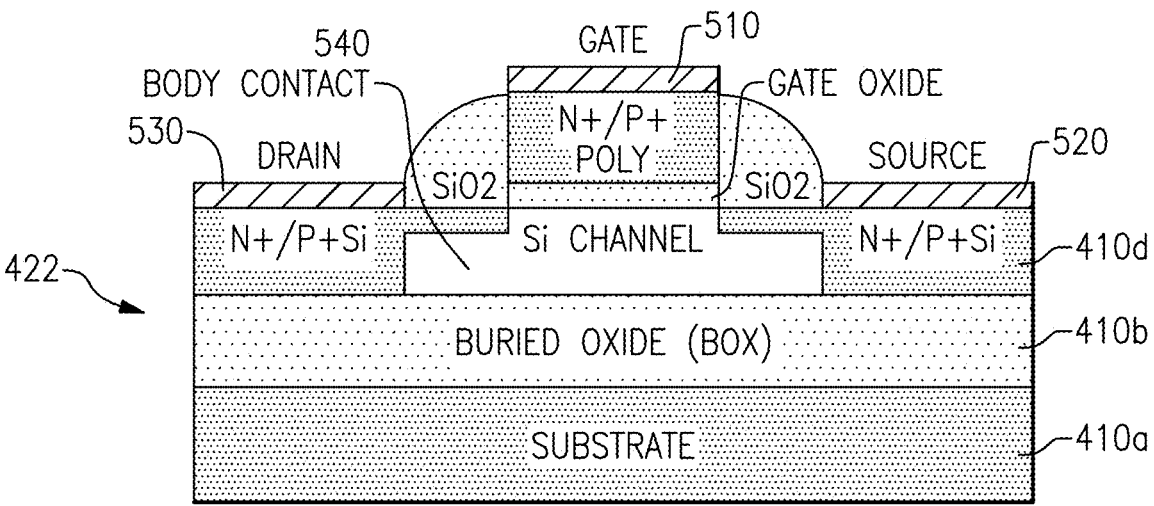
FIGS. 5A and 5B show side sectional and plan views of an example silicon-on-insulator (SOI) field-effect transistor (FET) device having an active FET implemented over a silicon substrate.
Figure 5B:
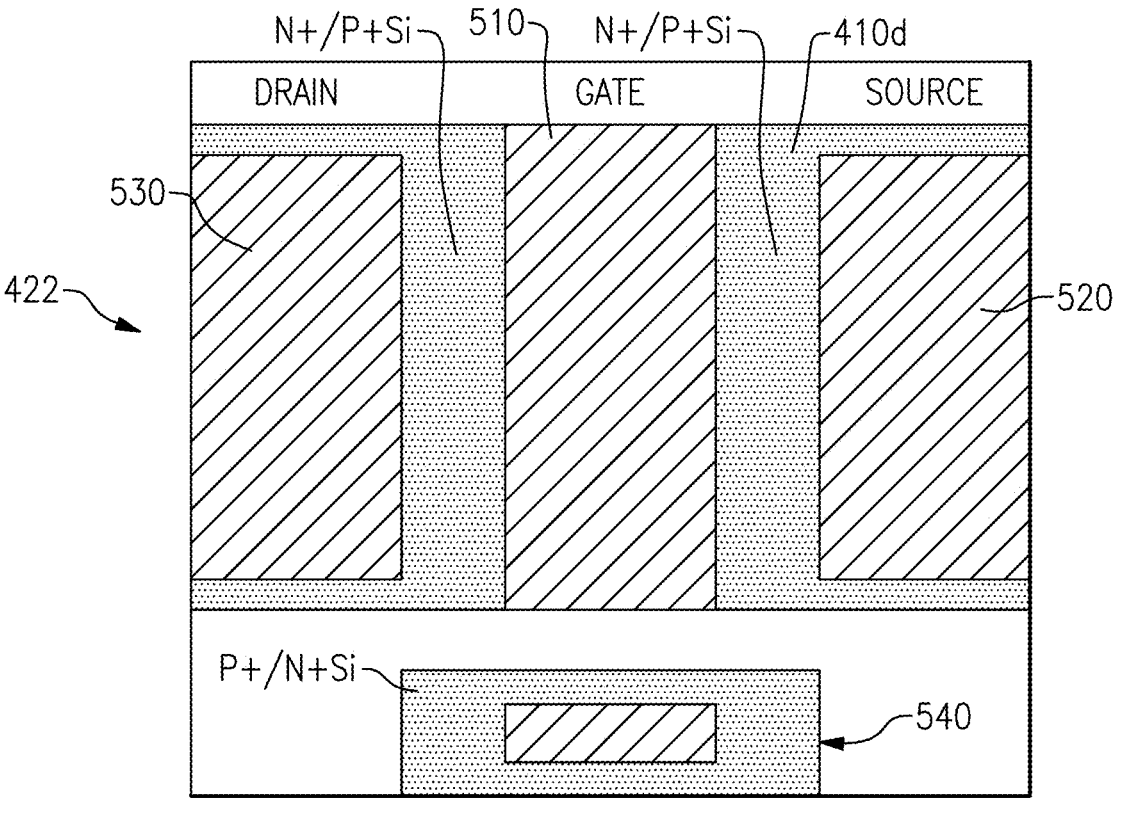

FIGS. 5A and 5B show side sectional and plan views of an example silicon-on-insulator (SOI) field-effect transistor (FET) device 422 having an active FET implemented over a silicon substrate. For example, the FET device 422 can be incorporated in the transistor-based active devices 420b of the module 400 of FIG. 4A. The substrate 410 can include a substrate layer 410a (e.g., silicon wafer substrate) that forms a substantially rectangular footprint of the module. Referring to FIGS. 4, 5A, and 5B, the SOI die 405 can additionally comprise a layer of insulating material 410b (e.g., silicon dioxide). In some embodiments, the layer of insulating material 410b is an oxide layer disposed over the substrate layer 410a.

Figure 6:
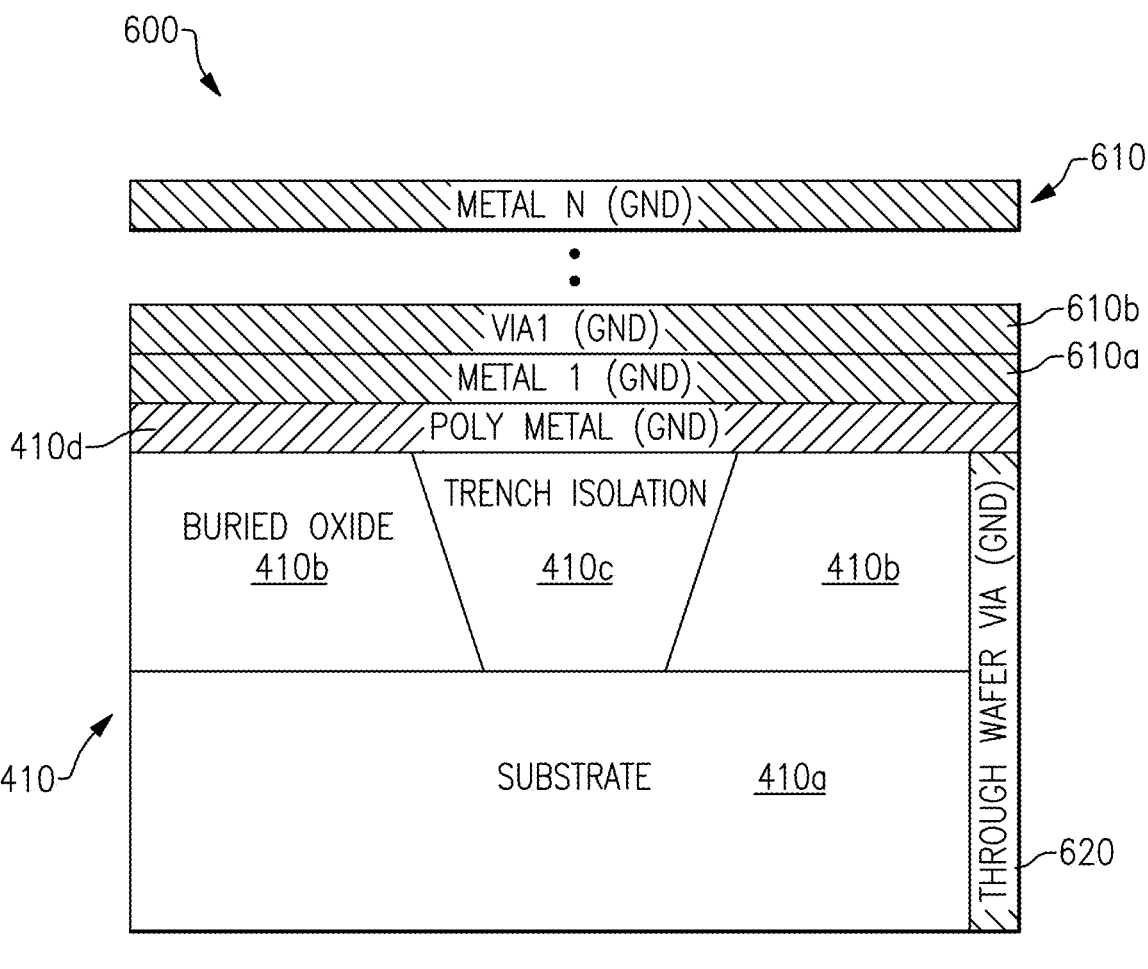
FIG. 6 is a schematic representation of a cross section of a portion of a SOI die including a polysilicon ground web, such as the SOI RF module of FIG. 4A.

FIG. 6 is a schematic representation of a cross section of a portion 600 of a SOI die including a segment of the polysilicon ground web 430, connected to ground via a through wafer via. For example, the die portion 600 may form part of the die 405 of the module 400 of FIG. 4A. As shown, a through wafer via 620 is connected to ground, thereby connecting the other conducting layers in the die stack to ground, including (from bottom to top), the polysilicon layer 410d, metal 1 layer 610a, via 1 layer 610b, and any additional conducting layers above the via 1 layer (e.g., up to and including via N, metal N).

As shown in FIG. 6, one or more discontinuities in the oxide layer 410b can form an isolation structure 410c (e.g., an isolation trench) extending at least partially through the oxide layer 410b to improve performance characteristics of the active devices 420. The polysilicon layer 410d is applied over the insulating layer 410b and any isolation structure(s) 410c. As will be described herein, the active devices 420b can comprise SOI transistors, such as the transistors shown in FIGS. 5A and 5B.

For ease of illustration, the RF module 400 of FIG. 4A is pictured with four groups of noise-carrying active devices 420 arranged in a substantially grid like pattern. However, other SOI RF modules can have considerably greater complexity, and may comprise dozens, hundreds, or more groups of active devices, and each group may in turn include a large number of active devices.

Referring to FIG. 4B, in certain embodiments, the RF module 400 can be a multi-chip module comprising a plurality of dies 405 with each group of active devices 420 distributed across the plurality of dies 405. FIG. 4B illustrates a SOI RF module 400 with a pair of interconnected dies 405. However, the RF module 400 can include additional dies 405 in other configurations.

Referring again to FIG. 4A, some or all of the active devices 420 may produce RF emissions which contribute to crosstalk or other forms of radio frequency interference (RFI) in the RF module 400.

Each group 420a of non-transistor-based active devices 420a at the left side of the module 400 of FIGS. 4A and 4B generally includes one or more non-transistor-based devices, e.g., devices not incorporating the polysilicon layer of the die. Such devices can include without limitation metal-insulator-metal (MIM) capacitors, oscillators, regulators, triggers, and inductors.

Each group 420b of transistor-based active devices 420b to the right side of the module 400 of FIG. 4A can include one or more active devices having at least one transistor or other device incorporating the polysilicon layer of the die. Such devices can include without limitation charge pumps, power amplifiers, low noise amplifiers, and radio frequency switches.

As part of a process of fabricating the transistor-based active devices 420b, the polysilicon layer 410d is applied over the insulating layer 410b of the SOI substrate 410. In certain embodiments, the polysilicon layer 410d is used along with other layers of the semiconductor die to form the SOI transistors (e.g., the gate, drain, and source of a field effect transistor). In the preferred embodiment, the polysilicon layer 410d can form a gate of one or more MOSFET SOI transistors.

Referring again to FIGS. 5A and 5B, the transistor 422 further includes terminals for the gate 510, source 520, and drain 530, as well as a body contact 540.

Due to the compact footprint of the RF module 400, RF emissions from the active devices 420a/b can create undesirable interference (including crosstalk) within the module 400. Particularly in high-power 5G NR applications, radio frequency interference (RFI) from neighboring active devices can represent a major obstacle to the miniaturization of RF packaged modules. Depending on the implementation of the RF module 400, RF noise can even travel outside the module, creating interference incident on other components of the mobile device 2a.

To mitigate such noise, noise shielding in the form of the polysilicon ground web 430 is provided in the polysilicon layer 410d to couple unwanted RF emissions to a circuit ground. The ground web 430 can reduce the footprint of the RF module 400 by allowing increased density of circuit elements without an associated increase in RFI.

Referring to FIGS. 5A, 5B, and 6, in alternate embodiments, additional layers of insulating material may be present in the insulating substrate, or the substrate may be formed in a single contiguous layer. The substrate 410 and various layers 410*a-d* can be formed by separation by implantation of oxygen (SIMOX). In other implementations, alternative fabrication methods, including separation by plasma implantation of oxygen (SPIMOX), can be used.

As discussed, the polysilicon layer 410*d* formed over the oxide layer 410*b* can be used in the fabrication of the transistor-based active devices 420*b*. In the RF module 400, the polysilicon layer 410*d* can form the plurality of ground paths 435 which comprise a ground-connected mesh or web 430 for coupling RF noise to a circuit ground 440. In this manner, the polysilicon layer 410*d* is used not only to form the transistor-based active devices 420*b*, but is also used for noise mitigation and shielding.

Referring to FIG. 6, the die 405 can include a plurality of conducting layers 610 (also referred to as device layers 610) that reside above the polysilicon layer 410, some or all of which can be incorporated into the transistors or other devices 420. In the embodiment shown in FIG. 6, the conducting layers 610 are alternating layers of metal and conducting vias. As shown, the conducting layers 610 in the regions of the conducting web 430 can be grounded through an electrical connection to the polysilicon layer 410*d*, which in turn is grounded by a through wafer via 620 connected to the circuit ground 440. In certain embodiments, only certain segments of the polysilicon ground web 430 may be grounded (such as, the ground paths 435), while other isolated regions of the polysilicon layer 410*d* are used in the fabrication of the transistor-based active devices 420*b*. As such, the polysilicon ground web 430 can be formed within a portion of the polysilicon layer 410*d* to provide RF noise shielding without requiring extensive modification of an existing RF module design.

The various ground paths 435 of the polysilicon layer 410*d* can form one or more conducting ground webs 430 adjacent to the active devices 420. The ground web 430 illustrated in FIGS. 4A and 4B is a grid of polysilicon (such as, polycrystalline silicon) configured to provide one or more low-resistance ground paths 435 that conduct analog RF signals within the RF module 400 to the circuit ground 440. In certain embodiments (such as, in a multi-chip module), the ground paths 435 can form two or more ground webs, each ground web on a separate die. Alternatively, as shown in FIG. 4B, a contiguous ground web can span across two or more dies and has one or more connections to the circuit ground.

The ground web 430 of FIGS. 4A and 4B comprises a plurality of straight-line segments which form a grid mesh of ground paths 435 adjacent to each of the active devices 420. Due to the proximity of the ground paths to each of the active devices 420, RF emissions from the active devices which otherwise would contribute to RFI are effectively coupled to the circuit ground 440 by the ground paths 435. Depending on the internal configuration of the RF module (factors can include the number of dies, number of separate ground webs, distance between active devices, layout of the active devices, etc.), the ground web 430 can include one or more termination points which connect to a common ground 440.

Figure 7A:
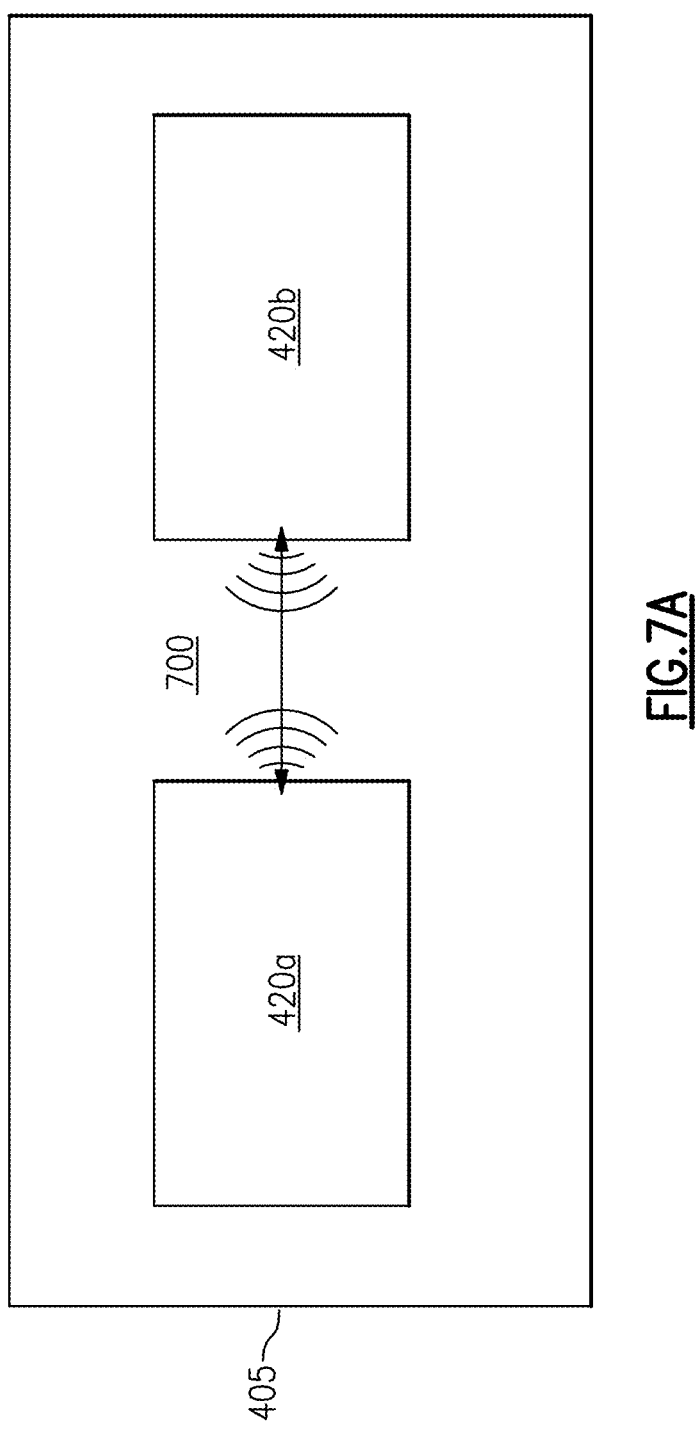
FIG. 7A illustrates crosstalk between active devices in an unshielded RF module.
Figure 7B:
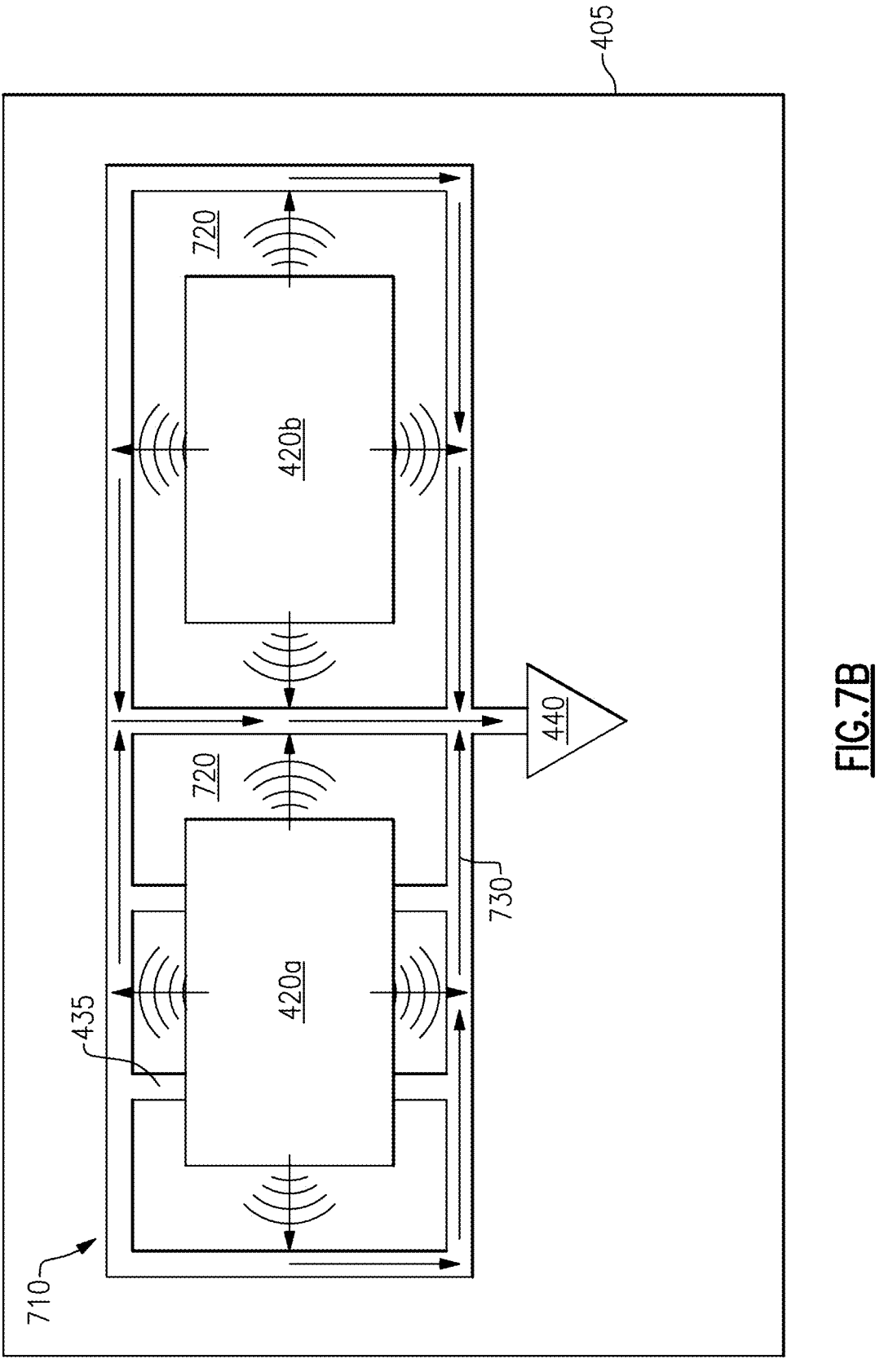
FIG. 7B illustrates a ground web coupling RF noise emissions to a circuit ground for crosstalk mitigation.

FIG. 7A illustrates crosstalk 700 between active devices 420*a*/420*b* in a packaged module 405 that does not include a ground web. FIG. 7B illustrates how an exemplary ground web 710 can couple RF emissions 720 to the circuit ground 440 to prevent crosstalk between neighboring active devices

420*a/b*. Coupling of the RF emissions to ground is indicated generally by 730. For the non-transistor-based active devices 420*a* which do not utilize the polysilicon layer 410*d* in their construction, the ground path segments 435 of the polysilicon ground web 710 can extend around and underneath the active devices 420*a* to couple analog and digital signal emissions directly at the source. These underlying ground path segments 435 can have the added advantage of compartmentalizing signal emissions within different areas of the active device to provide an additional layer of protection from RFI.

For the transistor-based active devices 420*b*, which are at least partially constructed using the polysilicon layer 410*d*, the ground web 430 does not extend underneath the active devices 420*b* to avoid shorting the SOI transistors of each active device to the circuit ground. Instead, the ground paths 435 to form a perimeter around each of these active devices 420*b* to compartmentalize the RF noise while maintaining electrical isolation of the portions of the polysilicon layer comprising the SOI transistors. The polysilicon ground web 430 thereby reduces RF noise of the RF module 400 without affecting the signal characteristics and performance of the module, allowing analog and digital active devices to operate together in close proximity.

The polysilicon ground web 430 can be formed at no additional expense during fabrication of the SOI transistors (for example, by screen printing), and does not require additional surface area on the die(s) to implement. The ground paths 435 can be routed between and/or underneath the active devices 420 to reduce RF noise within the module 400, without requiring extensive modification of existing designs or additional surface area dedicated to RF shielding. The RF shielding offered by the polysilicon web 430 can also contribute to reducing the overall footprint of the RF module 400 by allowing the active devices 420 to be located closer together without a risk of hazardous RFI.

The polysilicon ground web 430 can thereby eliminate or substantially attenuate RFI without altering signal characteristics of the RF module 400. Because the RF emissions of the active devices 420 are compartmentalized by the individual ground paths 435, the disclosed solution also reduces RF noise leakage into the substrate and can reduce RFI between neighboring RF modules.

In some embodiments, the RF module 400 is a front-end module (FEM) of the mobile device 2*a*. Devices of the FEM can include inductors, capacitors (such as MIM capacitors), band gap circuits, filters (such as bulk acoustic wave (BAW) and surface acoustic wave (SAW) filters), power amplifiers, oscillators, charge pumps, and various digital switching circuits. As will be discussed herein, a FEM of a mobile device can include a multitude of active devices 420, for which RF emissions can be eliminated or substantially reduced by the use of polysilicon ground web 430. Advantageously, the reduction in RFI allows analog and digital radio modules to operate in close proximity, conserving space in the mobile device 2*a* with a reduced footprint of the module 400.

Figure 8:
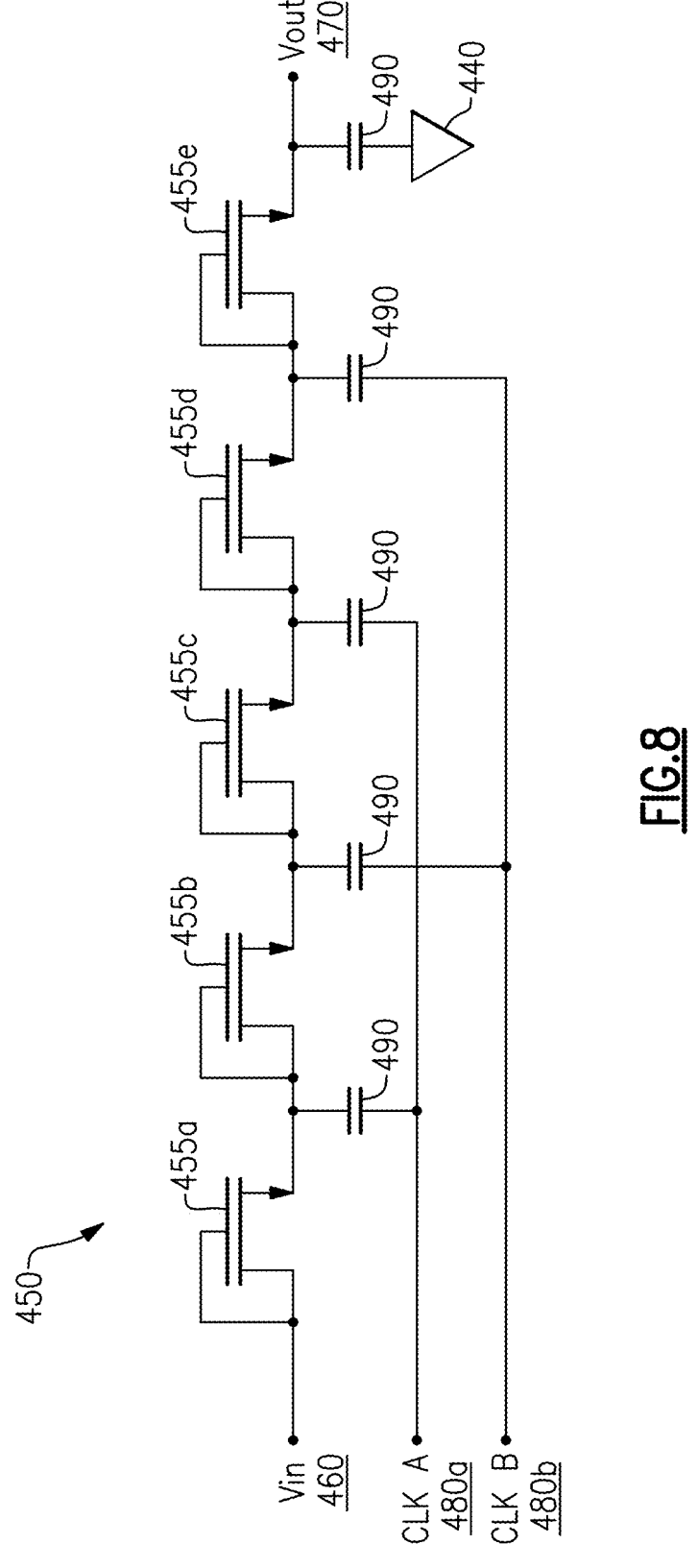
FIG. 8 is a schematic representation of a charge pump in the SOI RF module of FIG. 4A.

FIG. 8 is a schematic representation of a charge pump 450. The charge pump is one possible embodiment of the transistor-based active devices 420*b* of FIGS. 4A-4B. The charge pump 450 comprises a plurality of SOI transistors 455*a*-455*e* arranged in series, each of the transistors having a gate terminal, a drain terminal, and a source terminal. In the illustrated embodiment, the SOI transistors 455*a*-455*e* are NMOS transistors, though other transistors or combinations of transistors may be used. In certain embodiments, the charge pump 450 can include additional semiconductor devices (such as, diodes), or passive devices (such as, resistors or capacitors).

The SOI transistors 455a-455e are connected in series, the gate and drain terminals of each of the transistors electrically connected to the source terminal of a preceding transistor. The gate and drain terminals of the first stage transistor 455a are connected to a voltage input terminal 460, from which the charge pump 450 receives an input voltage $V_{in}$. The source terminal of the final stage transistor 455e is connected to a voltage output terminal 470, where the charge pump 450 can supply a boosted output voltage $V_{out}$ to the RF module 400. In the embodiment of FIG. 8, the boosted output voltage $V_{out}$ supplied by the charge pump 450 is about five times that of the input voltage $V_{in}$. Those skilled in the art will appreciate that alternate designs for the charge pump 450 are possible, including charge pumps with more or fewer SOI transistors. The architecture of the charge pump 450 can be adapted to supply different output voltages $V_{out}$ to the RF module 400, including but not limited to 0.5 volts, 1 volt, 3.3 volts, 5 volts, 6, volts, and 12 volts.

The source terminal of each of the SOI transistors 455a-455d is connected to one of two clock inputs 480a/480b by a capacitor 490 to supply the charge pump 450 with a pair of clock signals. In certain embodiments, the clock inputs 480a/480b can be RF signal inputs, and the RF module can include elements for signal conditioning and filtering (such as, SAW or BAW filters) at the RF signal inputs. The source terminal of the final stage transistor 455e can also be connected to the circuit ground 440 by a capacitor 490 to eliminate AC signal components from the output voltage $V_{out}$.

In the charge pump 450, rapid switching of the SOI transistors 455a-455e can contribute significantly to RF emissions of the RF module 400. The use of the polysilicon ground web 430 in the RF module 400, (e.g., surrounding the charge pump 450), can mitigate the RF emissions at little or no additional cost. The SOI transistors 455a-455e are formed above the insulating oxide layer 410b and isolation structure(s) 410c, and include at least portions of the poly-silicon layer 410d in their construction (e.g., the gate terminal 510 of each transistor). During manufacturing of the RF module 400, the polysilicon layer 410d is applied over the oxide layer 410b to form the plurality of SOI transistors which make up the charge pump 450 and other active devices 420. In certain embodiments, the polysilicon layer 410d can be deposited over the oxide layer 410b by screen printing.

Advantageously, the polysilicon ground web 430 can be formed in the polysilicon layer 410d during manufacturing of the SOI transistors 455a-455e. The ground web 430 does not require additional manufacturing equipment or surface area on the die 405, nor does it interfere with the fabrication of the SOI transistors. The ground web 430 can be integrated into an RF module 400 between the active devices 420, allowing RF noise shielding to be added to existing RF module designs at a reduced cost.

Figure 9:
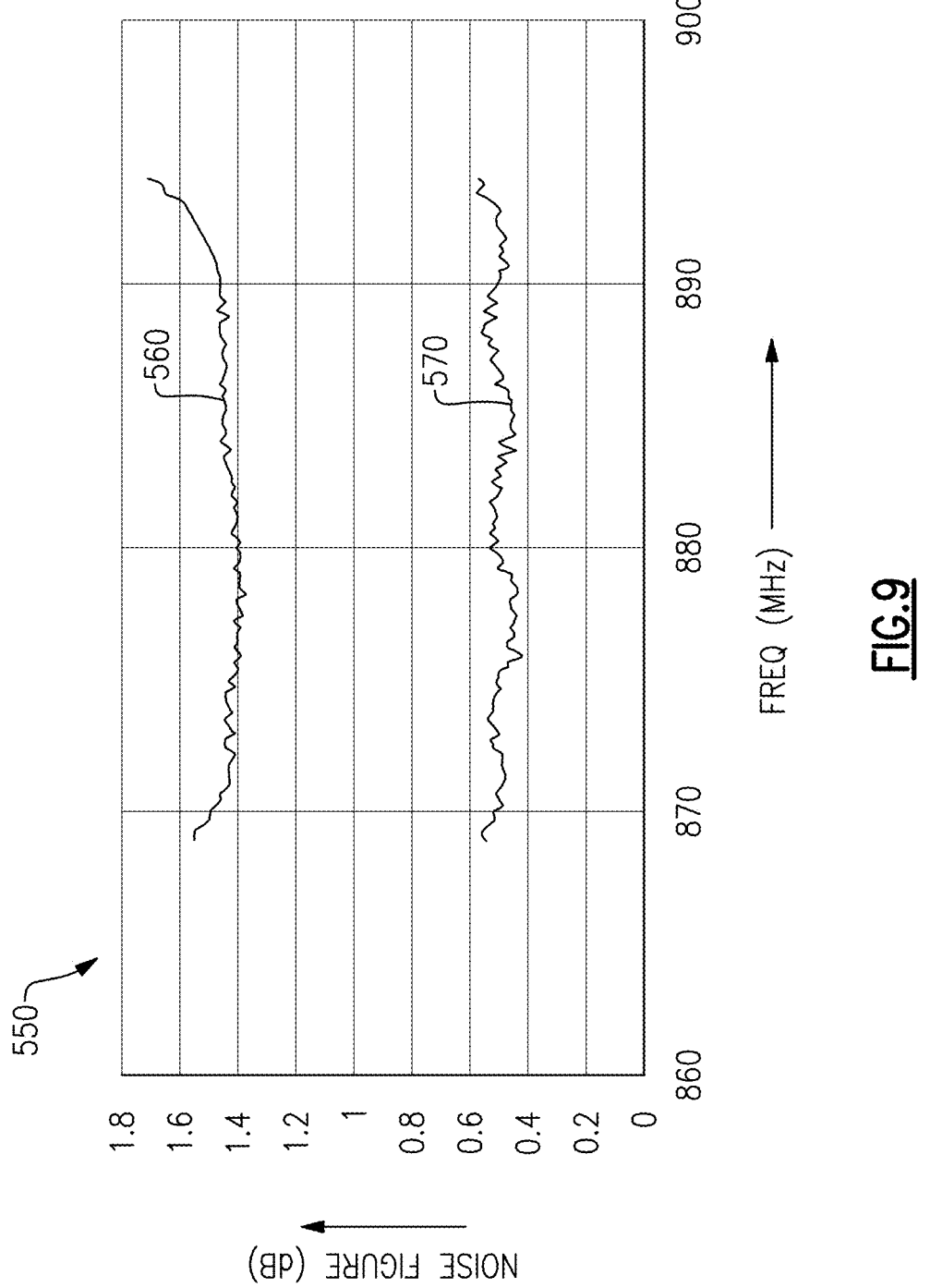
FIG. 9 is a graphical comparison of noise figures between an RF module with noise reduction and an RF module without noise reduction.

FIG. 9 is a graphical comparison of noise figures in an RF module with a polysilicon ground web for RF noise shielding and an RF module without noise shielding. A graph of noise figures for two RF modules over a frequency range of 860 MHz to 900 MHz is indicated generally by 550. Higher noise figures represent a degradation in signal-to-noise ratio (SNR), with the graph 550 indicating signal losses due to RF noise in either module.

The graph 550 shows a first set of noise figures 560 measured from within an unshielded RF module over a frequency range of about 869 MHz to about 894 MHz. Those skilled in the art will recognize the significance of these frequencies as part of the 800 MHz band commonly used in CDMA, LTE, and 5G NR applications for mobile communications.

A second set of noise figures 570 measured over the frequency range of about 869 MHz to about 894 MHz and corresponding to a shielded RF module (such as the module of FIG. 6) illustrates a substantial reduction in RF noise, which can be attributed to the polysilicon ground web 430. The first set of noise figures 560, corresponding to the unshielded RF module, range from about 1.4 dB to about 1.7 dB. The graph 550 also shows a greater intensity of RF noise measured near the band edges, reflecting a nonlinear response, which can present a challenge to noise mitigation by filtering. In contrast, the second set of noise figures 570 of the shielded RF module range from about 0.5 dB to about 0.6 dB, a significant reduction which can be attributed to the polysilicon ground web 430. Advantageously, the second set of noise figures 570 also show a roughly linear response, reducing the RF noise at either frequency extreme. The result is lower overall noise figures over the entire frequency range, and improved linearity of the RF noise curve to reduce RFI at specific frequencies.

Mobile Device

Figure 10A:
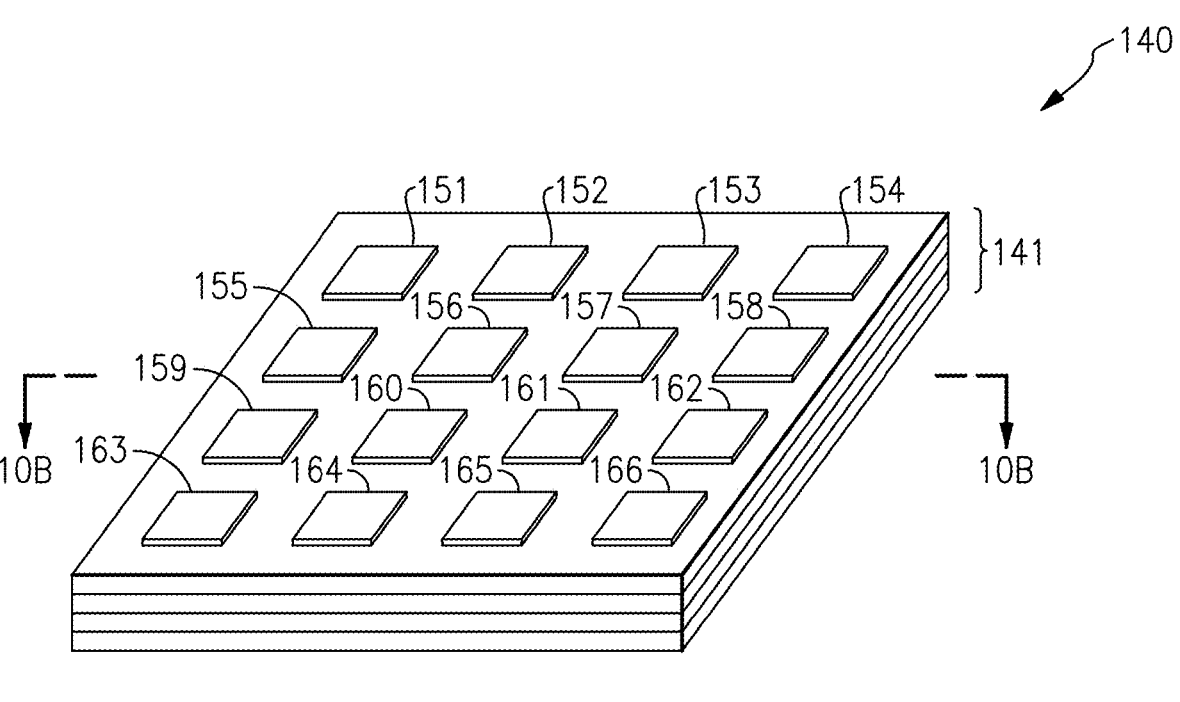
FIG. 10A is a perspective view of one embodiment of a module that operates with beamforming.
Figure 10B:
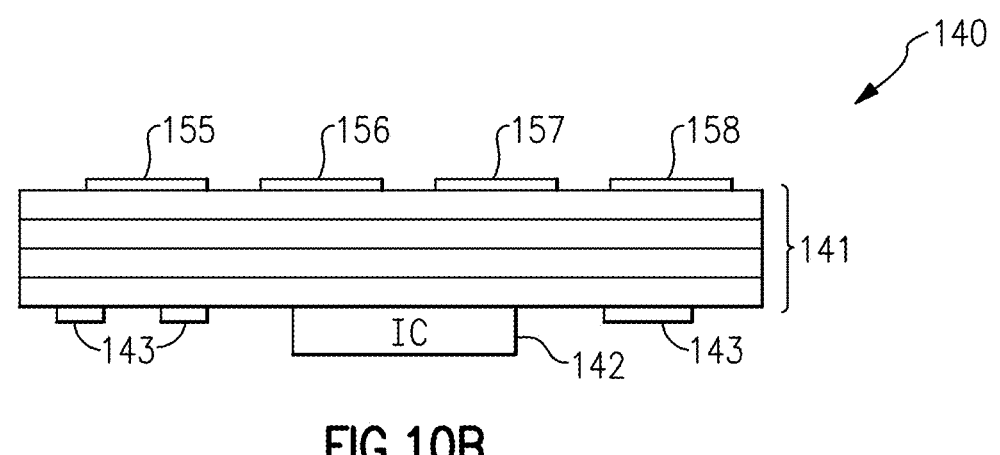
FIG. 10B is a cross-section of the module of FIG. 10A taken along the lines 10B-10B.

FIG. 10A is a perspective view of one embodiment of a shielded RF module 140 that operates with beamforming, and where the module 140 can incorporate a polysilicon ground web (not shown) to provide RFI mitigation. FIG. 10B is a cross-section of the module 140 of FIG. 10A taken along the lines 10B-10B.

The module 140 includes a laminated substrate or lami-nate 141, a semiconductor die or IC 142, surface mount components 143, and an antenna array including patch antenna devices 151-166.

Although one embodiment of a module is shown in FIGS. 10A and 10B, the teachings herein are applicable to modules implemented in a wide variety of ways. For example, a module can include a different arrangement of and/or num-ber of antenna elements, dies, and/or surface mount com-ponents. Additionally, the module 140 can include additional structures and components including, but not limited to, encapsulation structures, shielding structures, and/or wire-bonds.

In the illustrated embodiment, the antenna elements 151-166 are formed on a first surface of the laminate 141, and can be used to transmit and/or receive signals. Although the illustrated antenna elements 151-166 are rectangular, the antenna elements 151-166 can be shaped in other ways. Additionally, although a 4×4 array of antenna elements is shown, more or fewer antenna elements can be provided. Moreover, antenna elements can be arrayed in other patterns or configurations. Furthermore, in another embodiment, multiple antenna arrays are provided, such as separate antenna arrays for transmit and receive and/or multiple antenna arrays for MIMO and/or switched diversity.

In certain implementations, the antenna elements 151-166 are implemented as patch antennas. A patch antenna can include a planar antenna element positioned over a ground plane. A patch antenna can have a relatively thin profile and exhibit robust mechanical strength. In certain configura-tions, the antenna elements 151-166 are implemented as patch antennas with planar antenna elements formed on the first surface of the laminate 141 and the ground plane formed using an internal conductive layer of the laminate 141.

Although an example with patch antennas is shown, a modulate can include any suitable antenna elements, including, but not limited to, patch antennas, dipole antennas, ceramic resonators, stamped metal antennas, and/or laser direct structuring antennas.

In the illustrated embodiment, the IC 142 and the surface mount components 143 are on a second surface of the laminate 141 opposite the first surface.

In certain implementations, the IC 142 includes signal conditioning circuits associated with the antenna elements 151-166. In one embodiment, the IC 142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 142 includes signal conditioning circuits associated with the antenna elements 151-166 and an integrated transceiver.

The laminate 141 can be implemented in a variety of ways, and can include for example, conductive layers, dielectric layers, solder masks, and/or other structures. The number of layers, layer thicknesses, and materials used to form the layers can be selected based on a wide variety of factors, which can vary with application. The laminate 141 can include vias for providing electrical connections to signal feeds and/or ground feeds of the antenna elements 151-166. For example, in certain implementations, vias can aid in providing electrical connections between signaling conditioning circuits of the IC 142 and corresponding antenna elements.

The module 140 can be included in a communication system, such as a mobile phone or base station. In one example, the module 140 is attached to a phone board of a mobile phone.

Figure 11:
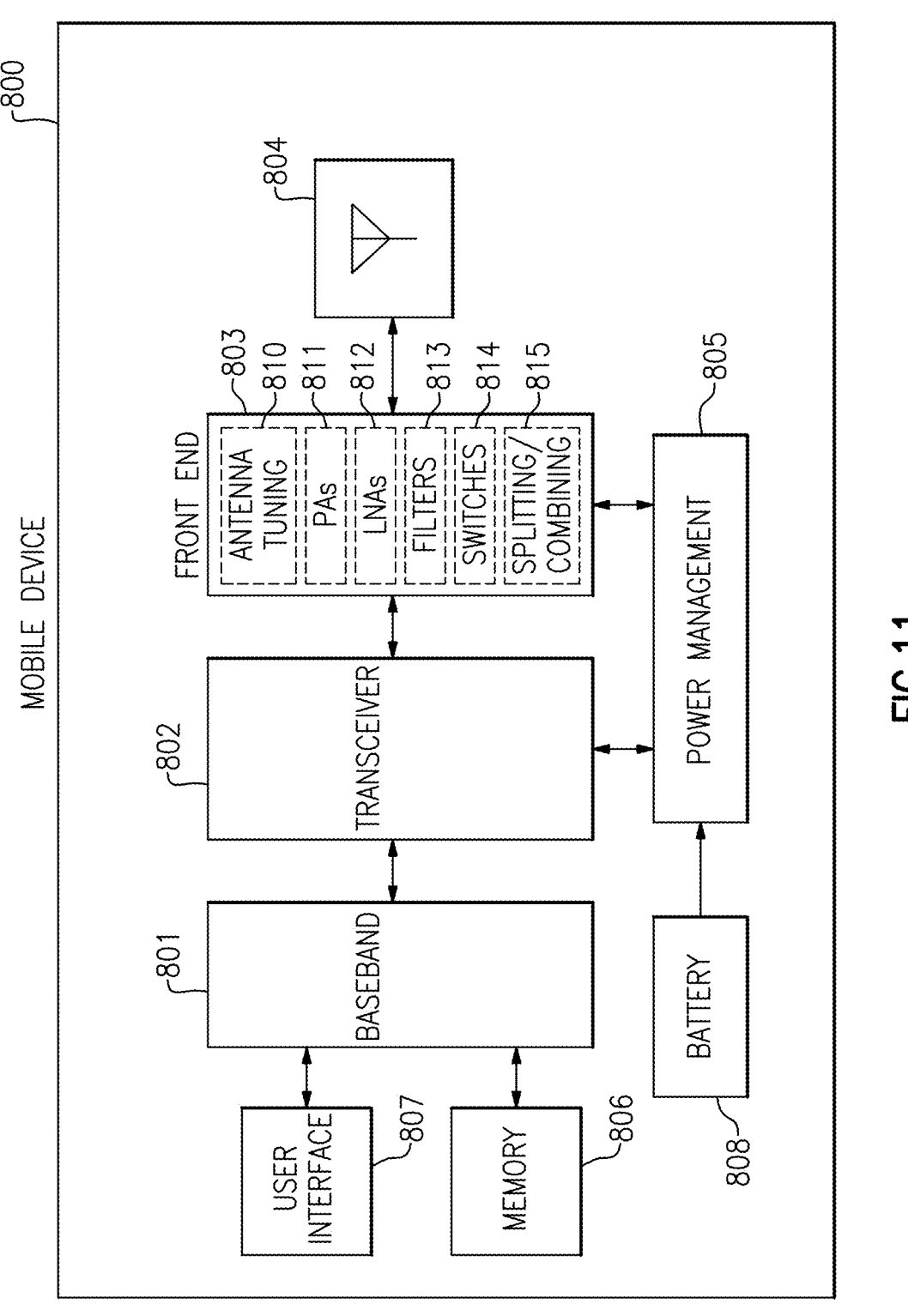
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can incorporate a polysilicon ground web as described herein. For example, the mobile device can include the modules 400 of FIG. 4A or 4B (e.g., as the front-end module 803).

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

Applications

Devices employing the above-described schemes can be implemented into various electronic devices and multimedia communication systems. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Features, materials, characteristics, or groups described in conjunction with a particular aspect, embodiment, or example are to be understood to be applicable to any other aspect, embodiment or example described herein unless incompatible therewith. All of the features disclosed in this specification (including any accompanying claims, abstract and drawings), and/or all of the steps of any method or process so disclosed, can be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only, and are not intended to limit the scope of protection. Indeed, the novel methods and systems described herein may be embodied in a variety of other forms. Furthermore, various omissions, substitutions, and changes in the form of the methods and systems described herein may be made. Those skilled in the art will appreciate that in some embodiments, the actual steps taken in the processes illustrated and/or disclosed may differ from those shown in the figures. Depending on the embodiment, certain of the steps described above may be removed, others may be added. For example, the actual steps and/or order of steps taken in the disclosed processes may differ from those shown in the figure. Depending on the embodiment, certain of the steps described above may be removed, others may be added. Furthermore, the features and attributes of the specific embodiments disclosed above may be combined in different ways to form additional embodiments, all of which fall within the scope of the present disclosure.

Conditional language used herein, such as, among others, "can," "could", "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied. Additionally, the words "herein," "above," "below," and words of similar import, when used in this application, refer to this application as a whole and not to any particular portions of this application.

Conjunctive language, such as the phrase "at least one of X, Y and Z," unless specifically stated otherwise, is to be understood with the context as used in general to convey that an item, term, etc. may be either X, Y, or Z, or a combination thereof. Thus, such conjunctive language is not generally intended to imply that certain embodiments require at least one of X, at least one of Y and at least one of Z to each be present.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations.

Although the present disclosure includes certain embodiments, examples and applications, it will be understood by those skilled in the art that the present disclosure extends beyond the specifically disclosed embodiments to other alternative embodiments and/or uses and obvious modifications and equivalents thereof, including embodiments which do not provide all of the features and advantages set forth herein. Accordingly, the scope of the present disclosure is not intended to be limited by the specific disclosures of preferred embodiments herein, and may be defined by claims as presented herein or as presented in the future.

What is claimed is:

1. A radio frequency module comprising:
a semiconductor die including a silicon substrate, a polysilicon layer, and a plurality of metal layers above the polysilicon layer;
a first active device formed in the semiconductor die and a second active device formed in the semiconductor die; and
a polysilicon ground web formed within the polysilicon layer and connected from the polysilicon layer to a circuit ground via a path formed from the polysilicon layer through silicon substrate, the polysilicon ground web extending around at least a portion of a periphery of the first active device, at least a portion of a periphery of the second active device, and between the first active device and the second active device.

2. The radio frequency module of claim 1 wherein the first active device includes a transistor and the second active device does not include a transistor.

3. The radio frequency module of claim 2 wherein the first active device includes a metal oxide semiconductor silicon-on-insulator transistor.

4. The radio frequency module of claim 2 wherein the second active device is a metal-insulator-metal (MIM) capacitor.

5. The radio frequency module of claim 2 wherein the polysilicon ground web extends beneath the second active device and does not extend beneath the first active device.

6. The radio frequency module of claim 2 wherein the radio frequency module is a radio frequency front-end module including one or more power amplifiers and one or more charge pumps.

7. The radio frequency module of claim 1 further comprising a through wafer via extending from the polysilicon layer through the silicon substrate to form the path to the circuit ground.

8. A semiconductor die comprising:
a silicon substrate, a polysilicon layer, and a plurality of metal layers above the polysilicon layer;
a first active device and a second active device; and
a polysilicon ground web formed within the polysilicon layer and connected from the polysilicon layer to a circuit ground via a path formed from the polysilicon layer through silicon substrate, the polysilicon ground web extending around at least a portion of a periphery of the first active device, at least a portion of a periphery of the second active device, and between the first active device and the second active device.

9. The semiconductor die of claim 8 wherein the first active device includes a transistor and the second active device does not include a transistor.

10. The semiconductor die of claim 9 wherein the first active device includes a metal oxide semiconductor silicon-on-insulator transistor.

11. The semiconductor die of claim 9 wherein the second active device is a metal-insulator-metal (MIM) capacitor.

12. The semiconductor die of claim 9 wherein the polysilicon ground web extends beneath the second active device and does not extend beneath the first active device.

13. The semiconductor die of claim 9 wherein the semiconductor die is a component of a radio frequency front-end module including one or more power amplifiers and one or more charge pumps.

14. The semiconductor die of claim 8 further comprising a through wafer via extending from the polysilicon layer through the silicon substrate to form the path to the circuit ground.

15. A mobile device comprising:
a radio frequency module including a semiconductor die including a silicon substrate, a polysilicon layer, and a plurality of metal layers above the polysilicon layer; a first active device formed in the semiconductor die and a second active device formed in the semiconductor die; and a polysilicon ground web formed within the polysilicon layer and connected from the polysilicon layer to a circuit ground via a path formed from the polysilicon layer through silicon substrate, the polysilicon ground web extending around at least a portion of a periphery of the first active device, at least a portion of a periphery of the second active device, and between the first active device and the second active device; and
an antenna coupled to the radio frequency module.

16. The mobile device of claim 15 wherein the first active device includes a transistor and the second active device does not include a transistor.

17. The mobile device of claim 16 wherein the second active device is a metal-insulator-metal (MIM) capacitor.

18. The mobile device of claim 16 wherein the polysilicon ground web extends beneath the second active device and does not extend beneath the first active device.

19. The mobile device of claim 16 wherein the radio frequency module is a radio frequency front-end module including one or more power amplifiers and one or more charge pumps.

20. The mobile device of claim 15 further comprising a through wafer via extending from the polysilicon layer through the silicon substrate to form the path to the circuit ground.

* * * * *